US010122495B2

(12) United States Patent
Henker et al.

(10) Patent No.: US 10,122,495 B2
(45) Date of Patent: Nov. 6, 2018

(54) FLEXIBLE POLYNOMIAL-BASED INTERLEAVER

(71) Applicant: NATIONAL INSTRUMENTS CORPORATION, Austin, TX (US)

(72) Inventors: Matthias Henker, Dresden (DE); Tim Taubert, Dresden (DE); Clemens Michalke, Dresden (DE)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 186 days.

(21) Appl. No.: 15/357,382

(22) Filed: Nov. 21, 2016

(65) Prior Publication Data

US 2017/0149452 A1    May 25, 2017

Related U.S. Application Data

(60) Provisional application No. 62/259,838, filed on Nov. 25, 2015.

(51) Int. Cl.
| | | |
|---|---|---|
| *H03M 13/00* | (2006.01) | |
| *H04L 1/00* | (2006.01) | |
| *H03M 13/27* | (2006.01) | |

(52) U.S. Cl.
CPC ........ *H04L 1/0071* (2013.01); *H03M 13/276* (2013.01); *H03M 13/2739* (2013.01); *H03M 13/2775* (2013.01)

(58) Field of Classification Search
CPC ............ H04L 1/0071; H03M 13/2739; H03M 13/276; H03M 13/2775; H03M 13/6561; H03M 13/395; H03M 13/2771
(Continued)

(56) References Cited

U.S. PATENT DOCUMENTS

| 9,344,118 | B2 * | 5/2016 | Joung | ............... H03M 13/2739 |
|---|---|---|---|---|
| 2007/0220377 | A1 * | 9/2007 | Park | ..................... H03M 13/276 |
| | | | | 714/701 |
| 2009/0138668 | A1 * | 5/2009 | Blankenship | ..... H03M 13/2739 |
| | | | | 711/157 |

OTHER PUBLICATIONS

3GPP TS 36.212 v10.9.0, Technical Specification Group Radio Access Network; Evolved Universal Terrestrial Radio Access (E-UTRA); Multiplexing and channel coding (Release 10); Sep. 2015; 3GPP Organizational Partners, Valbonne, France (16 pages).
(Continued)

*Primary Examiner* — Christine T. Tu
(74) *Attorney, Agent, or Firm* — Meyertons Hood Kivlin Kowert & Goetzel, P.C.; Jeffrey C. Hood; Michael B. Davis

(57) ABSTRACT

Techniques are disclosed relating to circuitry configured to interleave data, e.g., for use to process error correcting codes for wireless data transmission. In some embodiments an apparatus includes one or more circuit elements configured to receive input data samples, a plurality of polynomial coefficients, a start index, and information indicating a window size for non-sequential traversal of interleaver indices. The polynomial coefficients may include coefficients for at least a third-order polynomial. In some embodiments, the one or more circuit elements are further configured to generate interleaved bank and address information for writing the input data samples to the plurality of memory blocks, based on an order of the polynomial, a code block length, the start index, and the information indicating the window size. In some embodiments, the apparatus also includes output circuitry configured to provide interleaved data samples from the memory blocks.

20 Claims, 12 Drawing Sheets

(58) Field of Classification Search
USPC ....... 714/776, 701, 702, 763, 768, 769, 772, 714/773, 781, 782
See application file for complete search history.

(56) References Cited

OTHER PUBLICATIONS

Y. Sun and J. R. Cavallaro, "Efficient hardware implementation of a highly-parallel 3GPP LTE/LTE-advance turbo decoder," Integration, the VLSI journal, pp. 305-315, Jul. 17, 2010 (11 pages).

W. Liu, S. Chen, H. Chen, Y. Wang, S. Liu, K. Zhang and X. Ning, "A novel QPP interleaver for parallel turbo decoder," IEICE Electronics Express, vol. 10, No. 8, pp. 1-6, Apr. 25, 2013 (6 pages).

J. Lahtonen, J. Ryu and E. Suvitie, "On the Degree of the Inverse of Quadratic Permutation Polynomial Interleavers," IEEE Transactions on Information Theory, vol. 58, No. 6, pp. 3925-3932, Jun. 2012 (8 pages).

\* cited by examiner

FLEXIBLE POLYNOMIAL-BASED INTERLEAVER

This application claims the benefit of U.S. Provisional Application No. 62/259,838, filed on Nov. 25, 2015, which is incorporated by reference herein in its entirety.

TECHNICAL FIELD

Techniques are disclosed relating to wireless communications and more specifically to interleaver circuitry for error correcting codes.

DESCRIPTION OF THE RELATED ART

Modern wireless communications require high-performance error correction codes to detect and correct transmission errors. Turbo codes are one example of forward error correction (FEC) codes that are used in various contexts including cellular and satellite communications, for example. Conventional circuitry configured to perform encoding and/or decoding typically has limited performance, limited configurability and/or relatively large memory requirements. High-performance, flexible encoding and decoding circuitry with a limited memory footprint may be desired.

SUMMARY

Techniques are disclosed relating to circuitry configured to interleave data, e.g., for use to process error correcting codes for wireless data transmission.

In some embodiments, disclosed circuitry is configured to interleave memory accesses to facilitate data processing for error correcting codes, such as turbo codes. Disclosed techniques may achieve improved performance, additional configurability, and/or reduced memory requirements relative to traditional implementations.

In some embodiments an apparatus includes one or more circuit elements configured to receive input data samples, a plurality of polynomial coefficients, a start index, a step size, and/or information indicating a window size for non-sequential traversal of interleaver indices. The polynomial coefficients may include coefficients for at least a third-order polynomial. In some embodiments, the one or more circuit elements are further configured to generate interleaved bank and address information for writing the input data samples to the plurality of memory blocks, based on an order of the polynomial, a code block length, the start index, and the information indicating the window size. In some embodiments, the apparatus also includes output circuitry configured to provide interleaved data samples from the memory blocks.

In some embodiments, the apparatus is configurable for different polynomial orders, different interleaver patterns, different increment sizes, different traversal directions, etc. In some embodiments, the apparatus is configured to generate nested linear input index patterns to interleave writes to the memory blocks.

Figure 1:
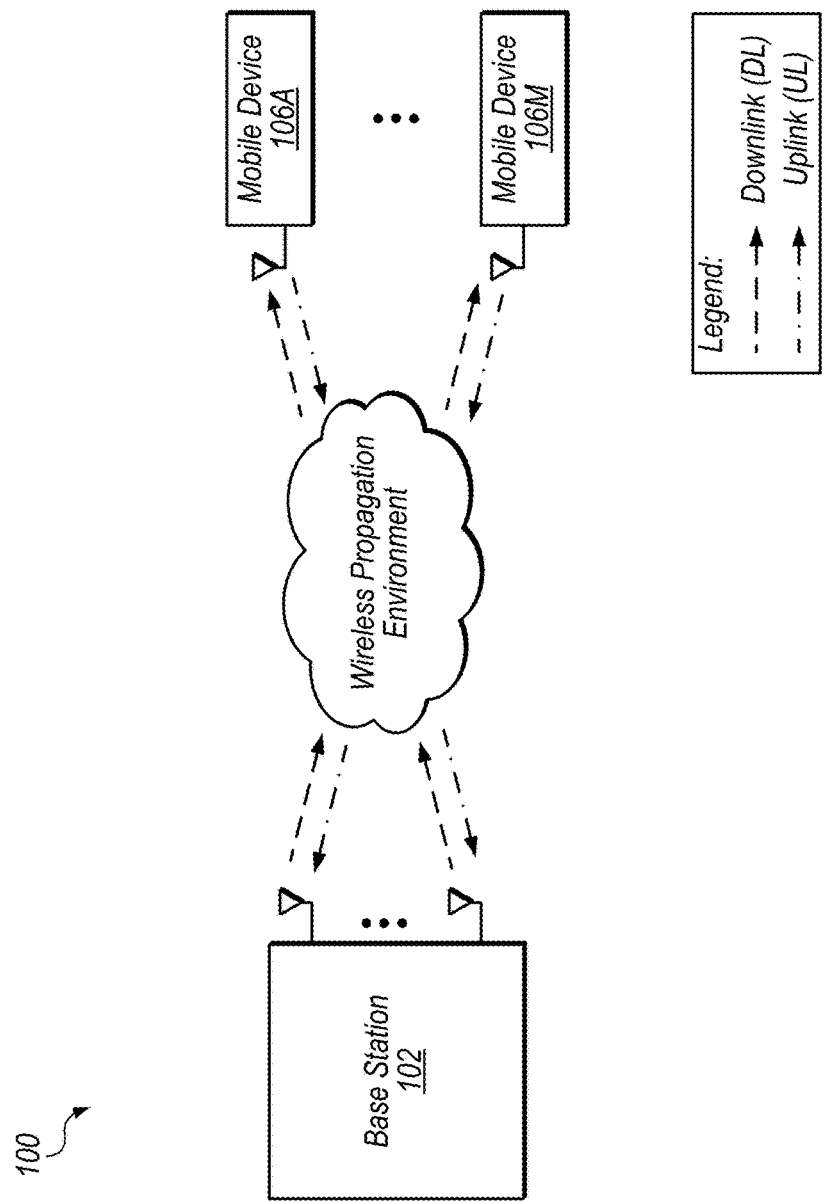
FIG. 1 illustrates exemplary wireless communications between a base station and multiple mobile devices.

While the disclosure is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present disclosure as defined by the appended claims.

The term "configured to" is used herein to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component.

DETAILED DESCRIPTION

Figure 10:
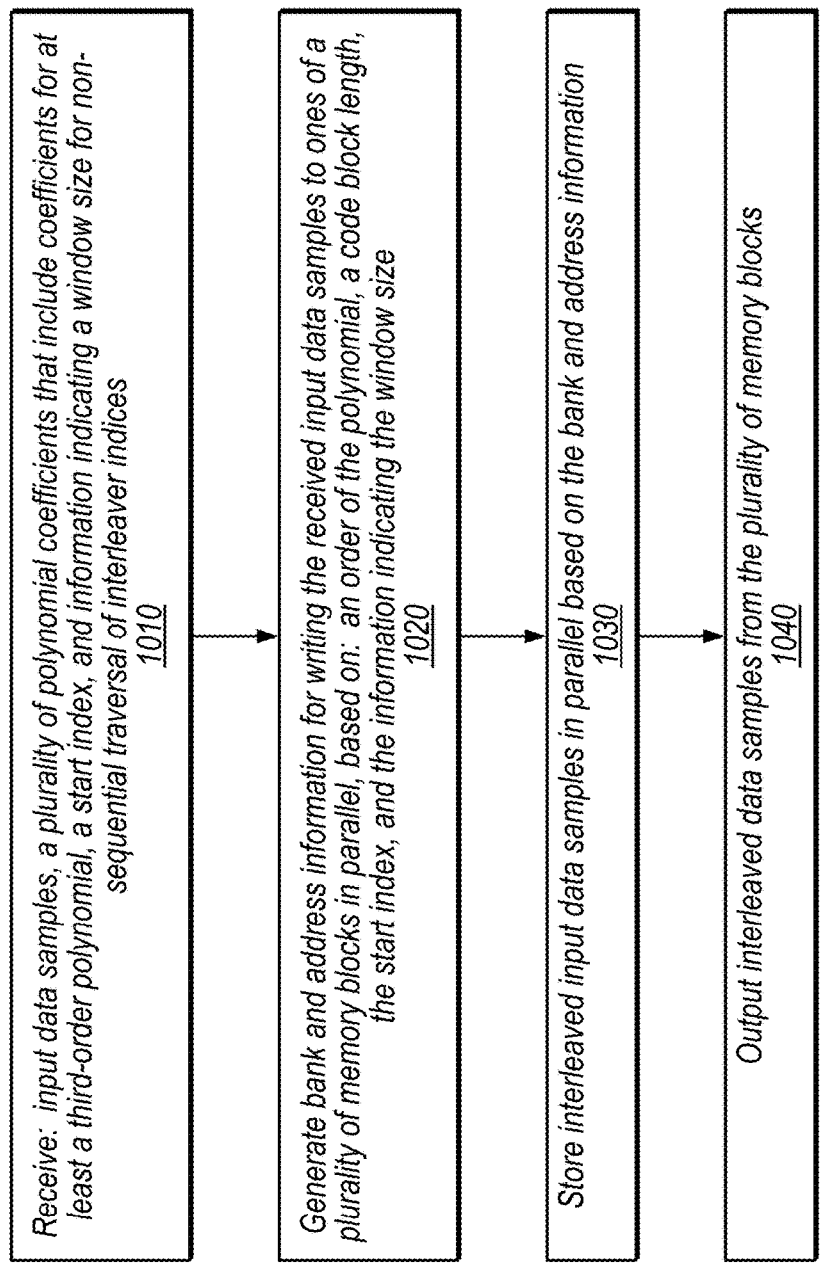
FIG. 10 is a flow diagram illustrating method for interleaving memory accesses, according to some embodiments.
Figure 11:
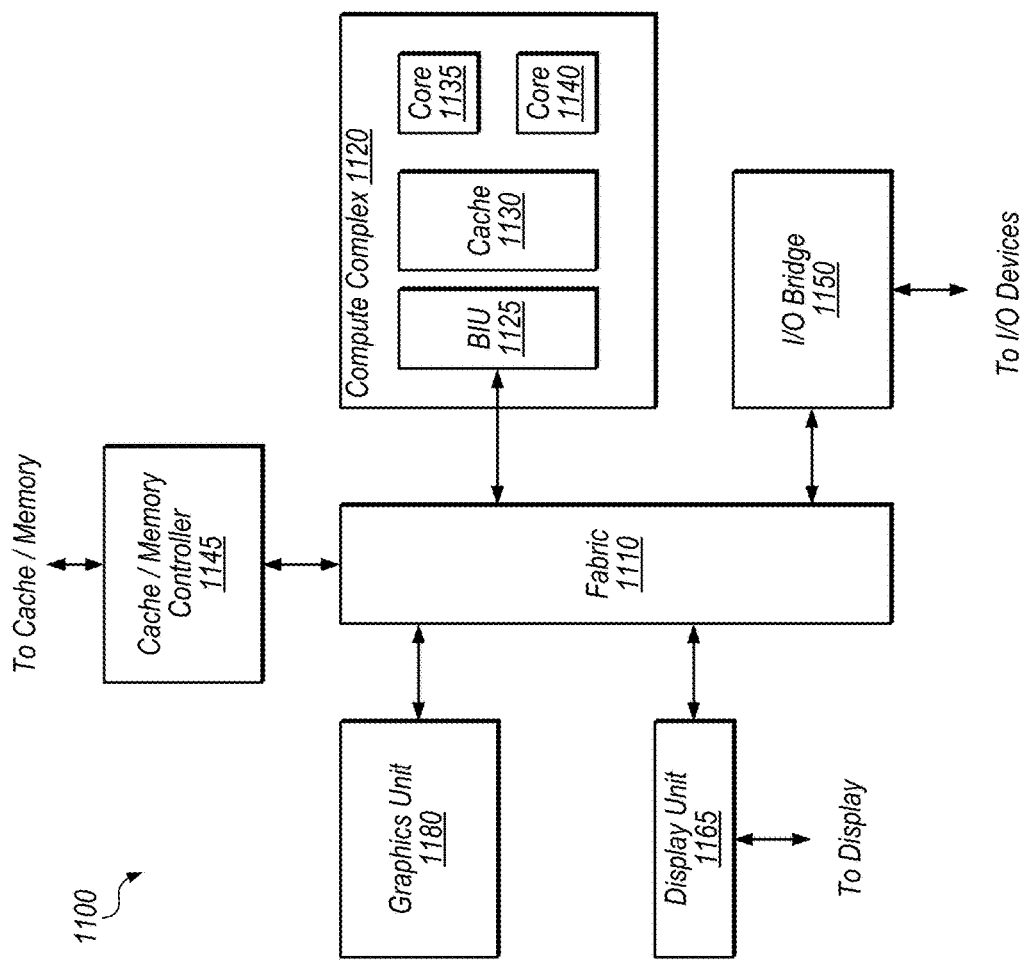
FIG. 11 is a block diagram illustrating an exemplary device, according to some embodiments.

This disclosure initially describes, with reference to FIG. 1, an exemplary wireless propagation environment that includes an exemplary mobile device and an exemplary base station. An overview of signal processing in the transmitter and receiver of a mobile communication system is discussed with reference to FIG. 2. General principles of turbo encoding and decoding are discussed with reference to FIGS. 3 and 4, respectively. Exemplary techniques for configurable parallel encoding/decoding are discussed with reference to FIGS. 5-9. FIGS. 10-12 respectively show an exemplary method, exemplary device, and exemplary computer-readable medium.

Exemplary Wireless Communication System

FIG. 1 shows an exemplary wireless communication system 100 that includes base station 102 and M mobile devices 106A-M (which may also be referred to as user equipment devices or UEs 106A-M). In the illustrated embodiment, base station 102 includes N antennas configured to transmit and receive data with mobile devices 106. In some embodiments, base station 102 may use time-division duplexing (TDD) or frequency-division duplexing (FDD), for example, to communicate with the different mobile devices. In the some embodiments, base station 102 is a multiple input multiple output (MIMO) base station, but in other embodiments non-MIMO techniques may be implemented.

Note that in some embodiments, techniques similar to those described below may be applied to various types of communications channels including non-cellular channels, wired channels, etc. Further, in some embodiments, similar techniques may be applied to storage using one or more potentially lossy storage mediums, where data to be written is encoded and data being read is decoded. This may improve data integrity in data-center applications, e.g., in conjunction with redundant storage. Thus, the disclosed system is included for exemplary purposes and is not intended to limit the scope of the disclosure.

In system 100, mobile devices 106 may concurrently communicate with base station 102 via the wireless propagation environment. In various embodiments, communications are encoded using one or more error correcting codes in order to avoid data loss in the wireless propagation environment.

Overview of Turbo Codes

Turbo Codes are widely used in modern mobile communications system such as UMTS and LTE. Turbo codes are high-performance forward error correction (FEC) codes that have very powerful Bit-Error-Rate (BER) performance close to the Shannon limit.

Figure 2:
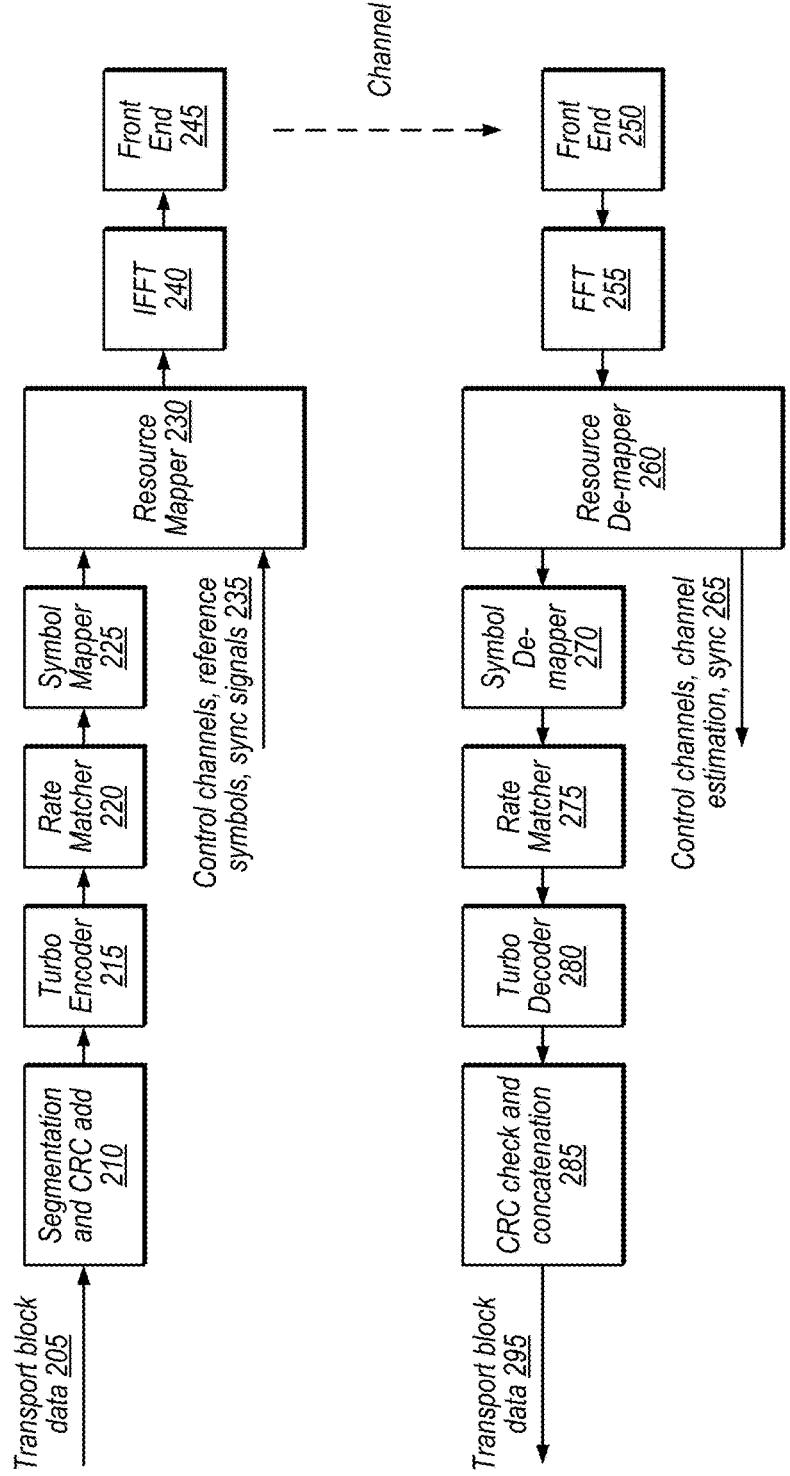
FIG. 2 illustrates exemplary receive and transmit chains that include a turbo decoder and encoder respectively, according to some embodiments.

FIG. 2 is a block diagram that shows a typical mobile communications system that uses turbo codes. In the illustrated embodiment, the turbo encoder and decoder are used to implement turbo codes for the communications. In the illustrated embodiment, the bits of the payload data channel are logically organized in transport blocks and code blocks where one or more code blocks form a transport block.

In the illustrated embodiment, the transmitter includes the following processing elements: segmentation and cyclic redundancy check (CRC) add module 210 (which receives transport block data 205 to be transmitted), turbo encoder 215, rate matcher 220, symbol mapper 225, resource mapper 230 (which receives control channels, reference symbols, and synchronization symbols and add this information 235 to the signal), inverse Fast Fourier Transform (IFFT) unit 250, and front end circuitry 245. In the illustrated embodiment, the transmitter transmits from front end 245 via a transmission channel to the front end circuitry 250 of the receiver. The channel may be wired or wireless. In the illustrated embodiment, the receiver includes FFT unit 255, resource de-mapper 260 (which outputs control channel, channel estimation, and synchronization information 265), symbol de-mapper 270, rate matcher 275, turbo decoder 280, and CRC check and concatenation module 285. In the illustrated embodiment, the receiver delivers transport block data 295. In various embodiments, turbo coding by encoder 215 and decoder 280 may facilitate reliable communications in the presence of various types of noise on the communications channel or channel distortion.

Figure 3:
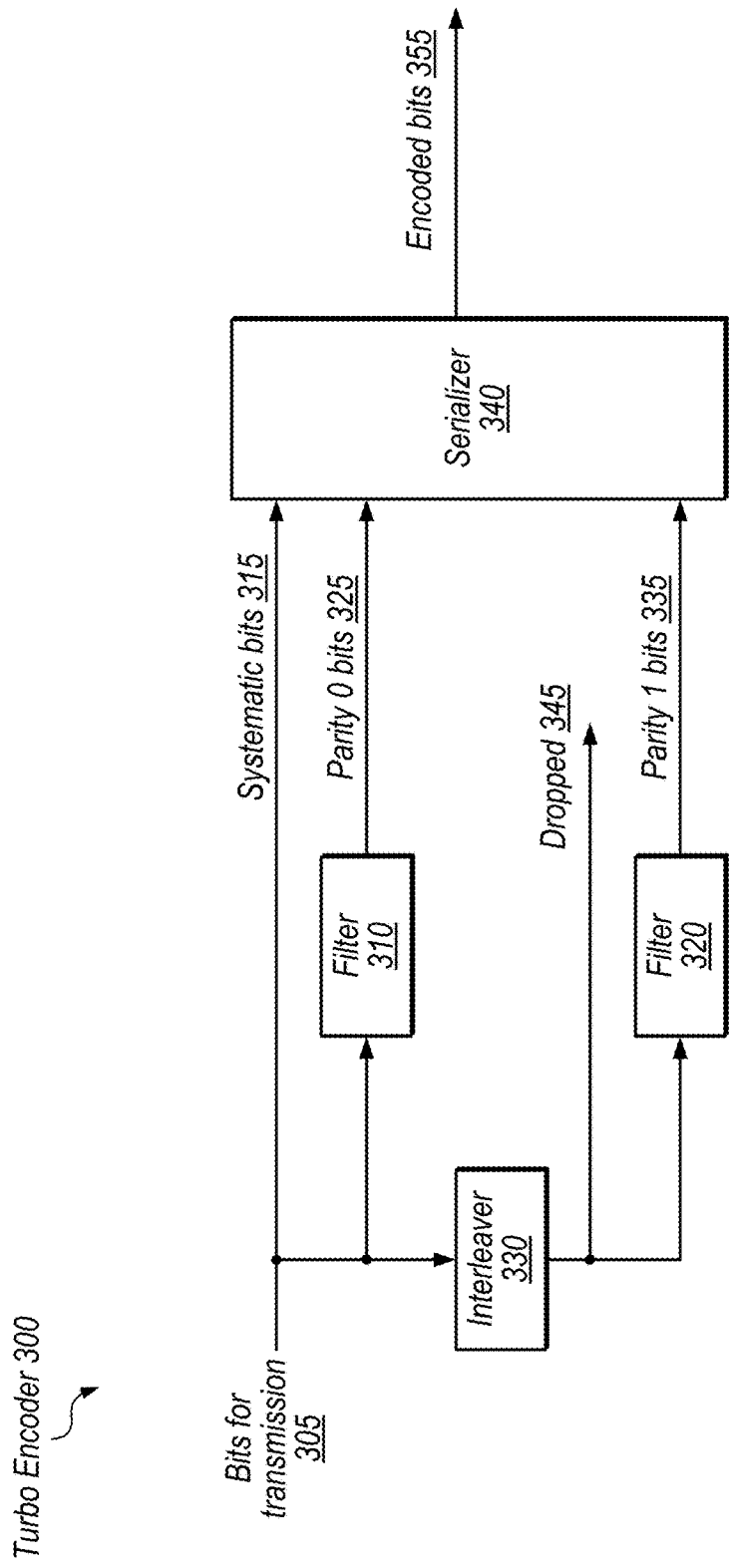
FIG. 3 illustrates an exemplary turbo encoder, according to some embodiments.

FIG. 3 is a block diagram of an exemplary turbo encoder 300 with parallel concatenated convolutional codes. In the illustrated embodiment, the encoder 300 includes filters 310 and 320, interleaver 330, and serializer 340. In the illustrated embodiment, encoder 300 receives bits for transmission 305 and encodes them to generate encoded bits 355.

Figure 4:
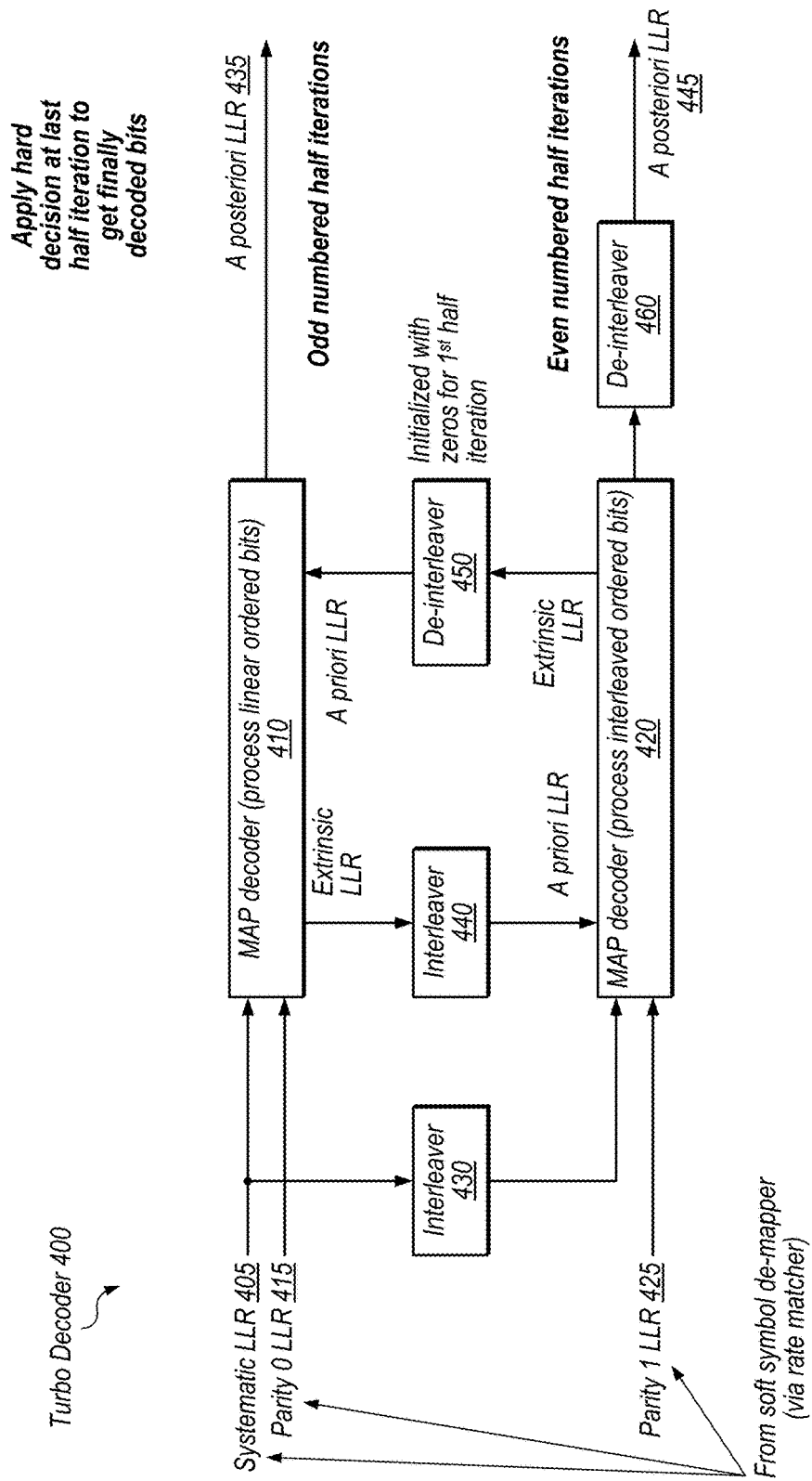
FIG. 4 illustrates an exemplary turbo decoder that utilizes an interleaver and de-interleaver, according to some embodiments.

FIG. 4 is a block diagram of an exemplary iterative turbo decoder 400, according to some embodiments. In the illustrated embodiment, decoder 400 includes interleavers 430 and 440, de-interleavers 450 and 460, and maximum a posteriori (MAP) decoders 410 and 420. In the illustrated embodiment, decoder 400 receives log likelihood ratio (LLR) bits 405, 415, and 425 from rate matcher 275 and decodes the incoming bits to generate a posteriori LLR bits 435 and 445.

The turbo encoder 300 and decoder 400 operate on code blocks consecutively where each code block has a configurable length of K information bits, in some embodiments. As shown in FIGS. 3 and 4, in some embodiments, the turbo encoder includes one or more interleaver blocks and the turbo decoder contains one or more interleaver blocks and one or more de-interleaver blocks. In some embodiments, the interleaver is configured to rearrange the order of bits within a code block of length K according to a defined permutation pattern. The de-interleaver may be implemented as an interleaver with a permutation pattern that is inverse to that of the interleaver. Thus, a cascade of an interleaver and a de-interleaver will produce the original order of bits again, in some embodiments.

An interleaver is typically defined by the permutation pattern including its length constraint (code block length K). For a given input input $c_i$ (with i=0, 1, . . . , (K−1)), the output of the interleaver may be defined as $c'_i = c_{\pi(i)}$ (with i=0, 1, . . . , (K−1)).

The LTE standard defines, for the Turbo Coder internal interleaver, so called Quadratic Polynomial Permutation (QPP) interleaver in 3GPP TS 36.212, "Evolved Universal Terrestrial Radio Access (E-UTRA); Multiplexing and channel coding" (Release 10). In this example, the explicit formula of QPP interleaver pattern is defined as $$\pi(i) = (f_1 \cdot i + f_2 \cdot i^2) \bmod K \quad \text{Equation 1}$$

where $f_1$ and $f_2$ are polynomial coefficients. In the LTE specification, there are 188 different code block lengths K and respective polynomial coefficients $f_1$ and $f_2$ for each respective value of K. In other implementations, any of various values of K and/or polynomial coefficients may be used. Further, polynomials of various orders may be implemented.

Interleaver Overview

Interleavers are often implemented as memory buffers where the write and read addresses (e.g., indices i and $\pi(i)$) are permuted according to the required interleaver pattern. A deinterleaver provides the inverse functionality, where either the read and write addresses are swapped or the inverse pattern $\pi^{-1}(i)$ is used. That means the implementation can be focused on the determination of the read and write addresses (i and $\pi(i)$ or $\pi^{-1}(i)$ ➔ calculate $\pi(i)$ for given i) of the interleaver memory buffer, in these embodiments.

The direct implementation of equation 1 may be very complex and time consuming due to the modulo K operation which is actually a division. Additionally, the calculation of the quadratic polynomial $f_1 \cdot i + f_2 \cdot i^2$ may require multipliers and adders with relatively large bitwidths.

Therefore, alternative ways to determine $\pi(i)$ for a given list of index values i may be advantageous. For example, the explicit formula in equation 1 may be transformed into a much simpler recursive algorithm $r(\cdot)$ for regular index lists i like for example i=0, 1, 2, . . . , (K−1). Equation 2 below provides a recursive description of QPP interleaver indices with typically $\Delta i=1$ or $\Delta i=-1$ (although other step values may be used in other embodiments):

$$\pi((i+\Delta i) \bmod K) = g(\pi(i), \Delta i) \text{ for } i \in [0, K-1] \text{ and a value}$$
$$\pi(i = i_{start}) \qquad \text{Equation 2}$$

The increasing demand for more data bandwidth in mobile communications leads to the demand for higher throughput in Turbo Decoder implementations. Thus, special techniques for Turbo Decoding (like parallelization and windowing) may be introduced to increase data throughput as well as lower resource usage of hardware. As a result of these techniques, at least two new challenges may arise. First, not only one permutation index calculation, but multiple (P) values with equidistant offset may be needed in parallel (see equation 3 below). The value P is the parallelization factor of the Turbo Decoder and is typically an integer factor of code block length K (K mod P=0).

$$\pi\left(\left(i+\Delta i+0\cdot\frac{K}{P}\right)\bmod K\right) = g\left(\pi\left(i+0\frac{K}{P}\right),\Delta i\right)$$

$$\pi\left(\left(i+\Delta i+1\cdot\frac{K}{P}\right)\bmod K\right) = g\left(\pi\left(i+1\frac{K}{P}\right),\Delta i\right) \text{ with } i \in [0, \ldots K/P-1]$$

$$\ldots = \ldots$$

$$\pi\left(\left(i+\Delta i+(P-1)\cdot\frac{K}{P}\right)\bmod K\right) = g\left(\pi\left(i+(P-1)\cdot\frac{K}{P}\right),\Delta i\right)$$

Equation 3

Figure 5:
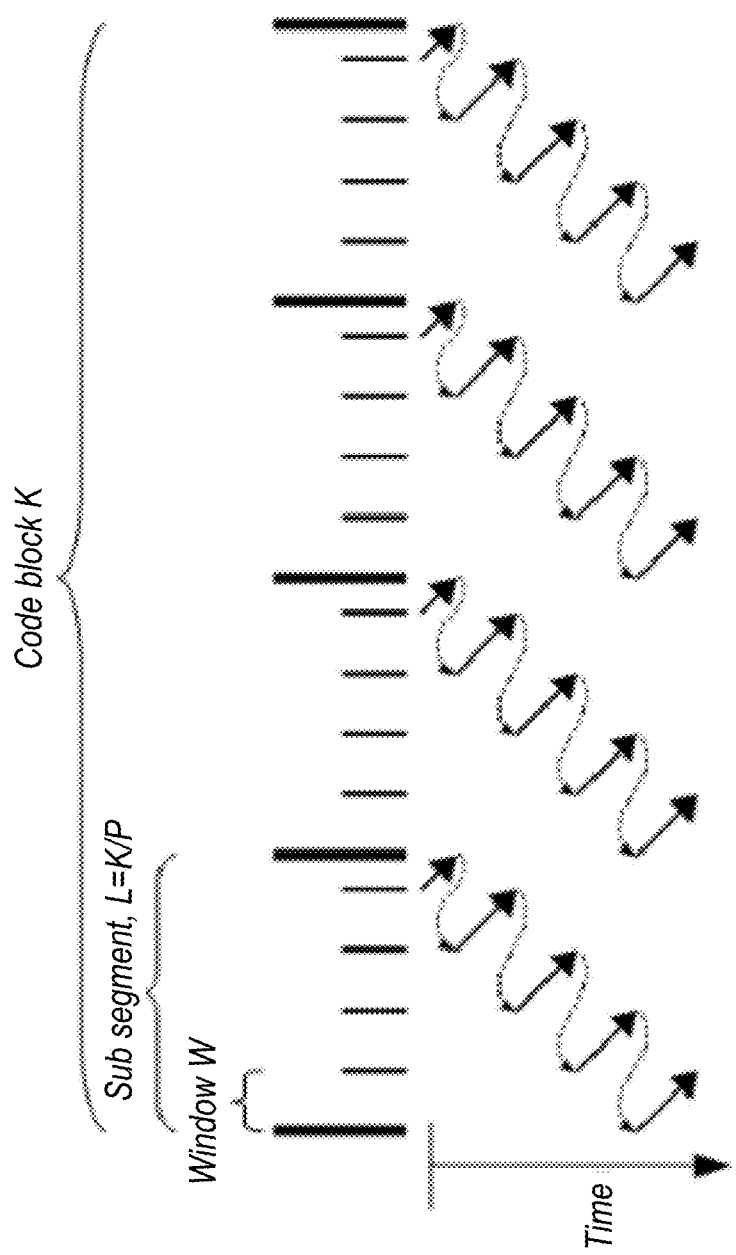
FIG. 5 illustrates an exemplary code block with nested sub segments.

Second, the index value list i is not simply the complete range in a row but is made up of several nested sub lists. For example with K=320, P=4, and $\Delta i=1$ the actual required index sequence (for P=0) can be i=70, 71, 72, ..., 79, 60, 61, 62, ..., 69, 50, 51, ..., 59, 40, ..., 0, 1, ... 9 instead of simply i=0, 1, 2, ..., 79. FIG. 5 illustrates this concept, where the code block K is divided into sub segments of size L=K/P and each sub segment has multiple windows. The index list does not proceed sequentially through the windows, but rather proceeds as indicated by the dotted lines and arrows. It may be undesirable, however, to store a large number of start values $\pi(i_{start,n})$ for each window segment, especially for multiple different values of K and P.

Exemplary Techniques for Generating Interleaver Indices

The explicit formula of equation 1 can be transformed into a recursive formula as in equation 2 to determine the interleaver index $\pi(i)$ for given K, $f_1$, $f_2$, $i_{start}$, and $\Delta i$ as shown in equation 4 below, according to the recursive algorithm to compute QPP interleaver indices:

$$\pi((i+\Delta i)\bmod K) = (f_1 \cdot (i+\Delta i) + f_2 \cdot (i+\Delta i)^2)\bmod K \qquad \text{Equation 4}$$

comes to =

$$g^{(0)}((i+\Delta i)\bmod K) = (g^{(0)}(i) + g^{(1)}(i))\bmod K$$

$$g^{(1)}((i+\Delta i)\bmod K = (g^{(1)}(i) + g^{(2)})\bmod K$$

with $$g^{(0)}(i_{start}) = (f_1 \cdot i_{start} + f_2 \cdot i_{start}^2)\bmod K$$

$$g^{(1)}(i_{start}) = (f_1 \cdot \Delta i + f_2 \cdot \Delta i^2 + 2f_2 \cdot \Delta i \cdot i_{start})\bmod K$$

$$g^{(2)} = const = (2f_2 \cdot \Delta i^2)\bmod K$$

QPP-interleavers also provide contention-free memory bank access for a segment length L=K/P with K mod P=0 (the bank addresses are not the same) as shown in equation 5A. Furthermore, the resulting index (interleaver address) with each segment (memory bank) is identical as shown in equation 5B.

$$b_n(i) = \left\lfloor \frac{\pi(i+n\cdot L)}{L} \right\rfloor \neq b_m(i) = \qquad \text{Equation 5A}$$

$$\left\lfloor \frac{\pi(i+m\cdot L)}{L} \right\rfloor \text{ for } i \in [0, L-1] \text{ and } n \neq m \in [0, P-1]$$

where $\lfloor \cdot \rfloor = \text{floor}(\cdot)$.

$$a_{n(i)} = (\pi(i+n\cdot L))\bmod L = a_m(i) = (\pi(i+m\cdot L))\bmod L \text{ for}$$
$$i \in [0, L-1] \text{ and } n,m \in [0, P-1] \qquad \text{Equation 5B}$$

This holds for all parallelization factors P which are integer factors of all supported code block lengths K (e.g. for all 188 code block length K listed in the LTE standard would support P=1, 2, 4, 8 ➔ K mod P=0 for all K and P). Because of the relationship between interleaver addresses shown in equation 5B, much of the following discussion refers to a single interleaver address $a_0(i)$, but similar techniques may be used with multiple interleaver addresses for parallelization factors that are not integer factors of supported code block lengths, for example.

Speaking generally, for parallelized computation of interleaver indices it is possible to separate the computation of the interleaver index $a_n(i)$ within each segment from the segment (or memory bank) index $b_n(i)$. Equation 6 shows this splitting of the QPP interleaver index of a code block into the interleaver index within code segment and the segment index:

$$\pi(i+nL) = L \cdot b_n(i) + a_n(i)$$

with $$b_n(i) = (b_0(i) + f_1 \cdot n + f_2 \cdot L \cdot n^2 + 2 \cdot f_2 \cdot i \cdot n) \bmod P$$

$$a_n(i) = a_0(i)$$

$$n, b_n \in [0, P-1]$$

$$a_n(i) \in [0, L-1] \qquad \text{Equation 6}$$

Figure 6:
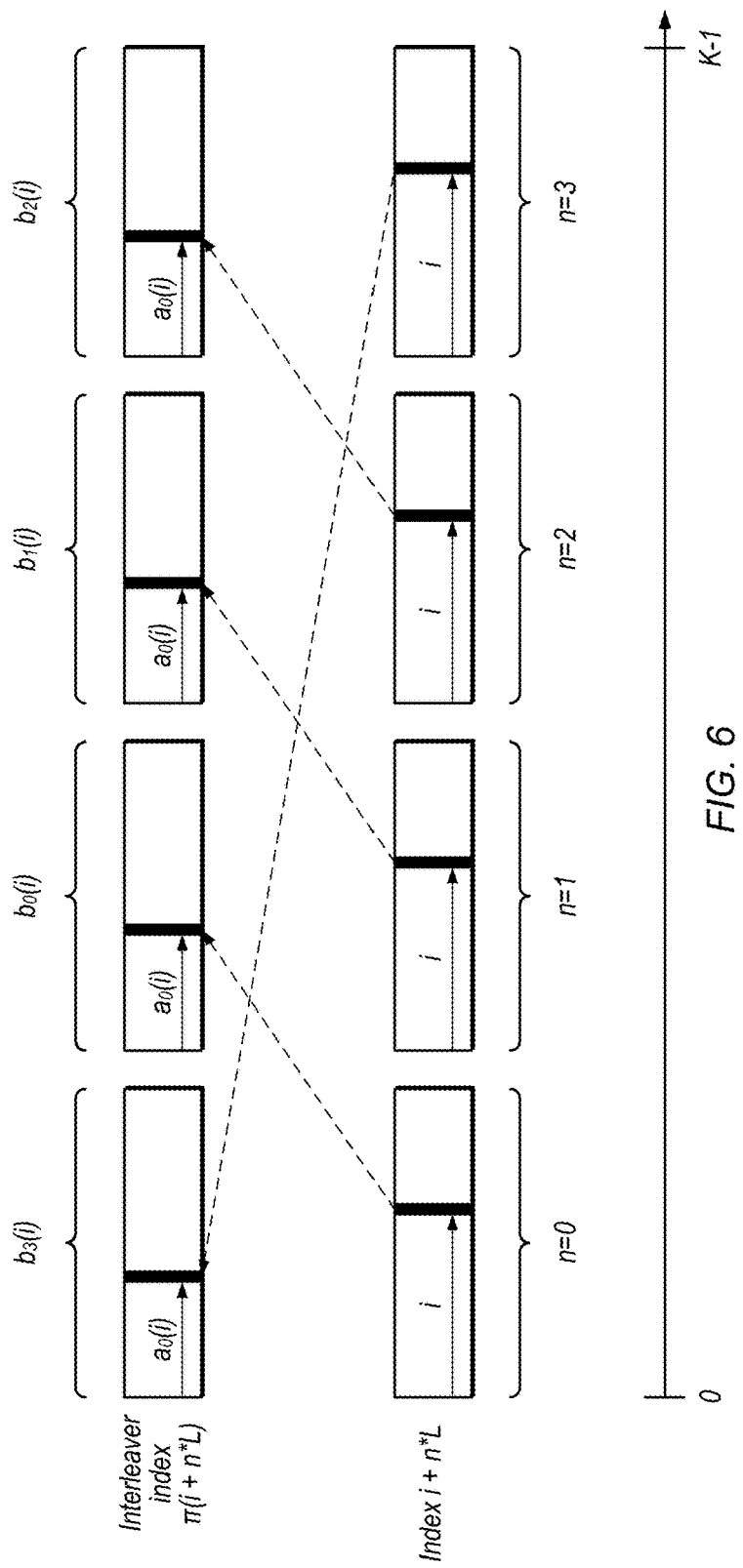
FIG. 6 illustrates exemplary segment and interleaver indices, according to some embodiments.

FIG. 6 is a diagram illustrating exemplary segment indices $b_0(i)$ through $b_3(i)$ and interleaver index $a_0(i)$ for a code block with length K, a parallelization factor P=4, and a segment length L=K/P.

For the application of turbo decoding, deinterleaver functionality is also needed. One option is to use the inverse interleaver function $\pi^{-1}(i)$ which leads to a regular (de) interleaver integration within the turbo decoder. Unfortunately, however, the inverse of some of the 188 listed QPP interleavers with length K are not QPP interleavers (quadratic polynomials) but are rather of cubic or even quartic degree.

Exemplary Extensions to QPP-Interleaver Index Generator

In some embodiments a generalized interleaver index (or address) generator is configured as a polynomial-based interleaver over integer rings. In particular, two extensions to recursive QPP-interleaver index (or address) generator algorithms are proposed.

First, in some embodiments, the recursive interleaver index generator (see, e.g., equation 6 above) is extended to also support polynomials of higher degree than 2. In some embodiments, polynomials of at least degree 4 (quartic polynomial permutation) are supported. In these embodiments, all inverse functions of all LTE QPP-interleavers (LTE) listed can be generated. Extension to even higher degrees are possible, however, and are presented herein.

Second, in some embodiments, the recursive interleaver index generator is extended so that not only a single linear index list i is supported but also nested linear index lists.

The contention-free polynomial based interleaver with degree H (e.g., H=2 for QPP interleaver) over integer rings is implemented according to equation 7 below, where K=code block length and $f_h$ are polynomial coefficients.

$$\pi(i) = \left(\sum_{h=1}^{H} f_h \cdot i^h\right) \bmod K \qquad \text{Equation 7}$$

In some embodiments, the interleaver is parallelized in P (where K mod P=0), such that P equidistant interleaver indices (distance L=K/P) are generated in parallel according to equation 8 below:

$$\pi(i + 0L) = L \cdot b_0(i) + a_0(i) \qquad \text{Equation 8}$$
$$\pi(i + 1L) = L \cdot b_1(i) + a_1(i)$$
$$\dots \dots \dots$$
$$\pi(i + (P-1)L) = L \cdot b_{P-1}(i) + a_{P-1}(i)$$

with $$b_n(i) \in [0, P-1]$$
$$i, a_n(i) \in [0, L-1]$$

In some embodiments, the interleaver values $\pi(\cdot)$ are generated recursively for $$i=i_s(0); i_s(0)+\Delta i; i_s(0)+2\Delta i; \dots \qquad \text{Equation 9}$$

Where $i_s(0)=i_{start}$ and the operation mod L is applied to all indices. In some embodiments, $\Delta i \in [0, L-1]$. To get a step size of −1, for example, $\Delta i$ may be set to L−1.

Such an index sequence may be referred to as a window and contains up to W elements (where W may be referred to as window length, e.g., as shown in FIG. 5). In some embodiments, the interleaver start index values $i_s$ used to compute the interleaver values according to equation 9 are also updated recursively. Thus, equation 10 shows the recursive determination of the start index of the next window.

$$i_s(w+1)=i_s(w)-W \qquad \text{Equation 10}$$

The following table (table 1) shows an example for a nested index sequence list i for a code block length K=408, a parallelization order of P=4, a segment length L=K/P=102, a window length W=32, and a step size of $\Delta i=1$. This nested index sequence list is similar to that shown in FIG. 5, for example.

TABLE 1

|  | i + 0 · L | i + 1 · L | i + 2 · L | i + 3 · L |
|---|---|---|---|---|
| $i_s(0)$ = 64 | 96 … 101 | 198 … 203 | 300 … 305 | 402 … 407 |
| $i_s(1)$ = 64 | 64 … 95 | 166 … 197 | 268 … 299 | 370 … 401 |
| $i_s(2)$ = 32 | 32 … 63 | 134 … 165 | 236 … 267 | 338 … 369 |
| $i_s(3)$ = 0 | 0 … 31 | 102 … 133 | 204 … 235 | 306 … 337 |

Figure 7:
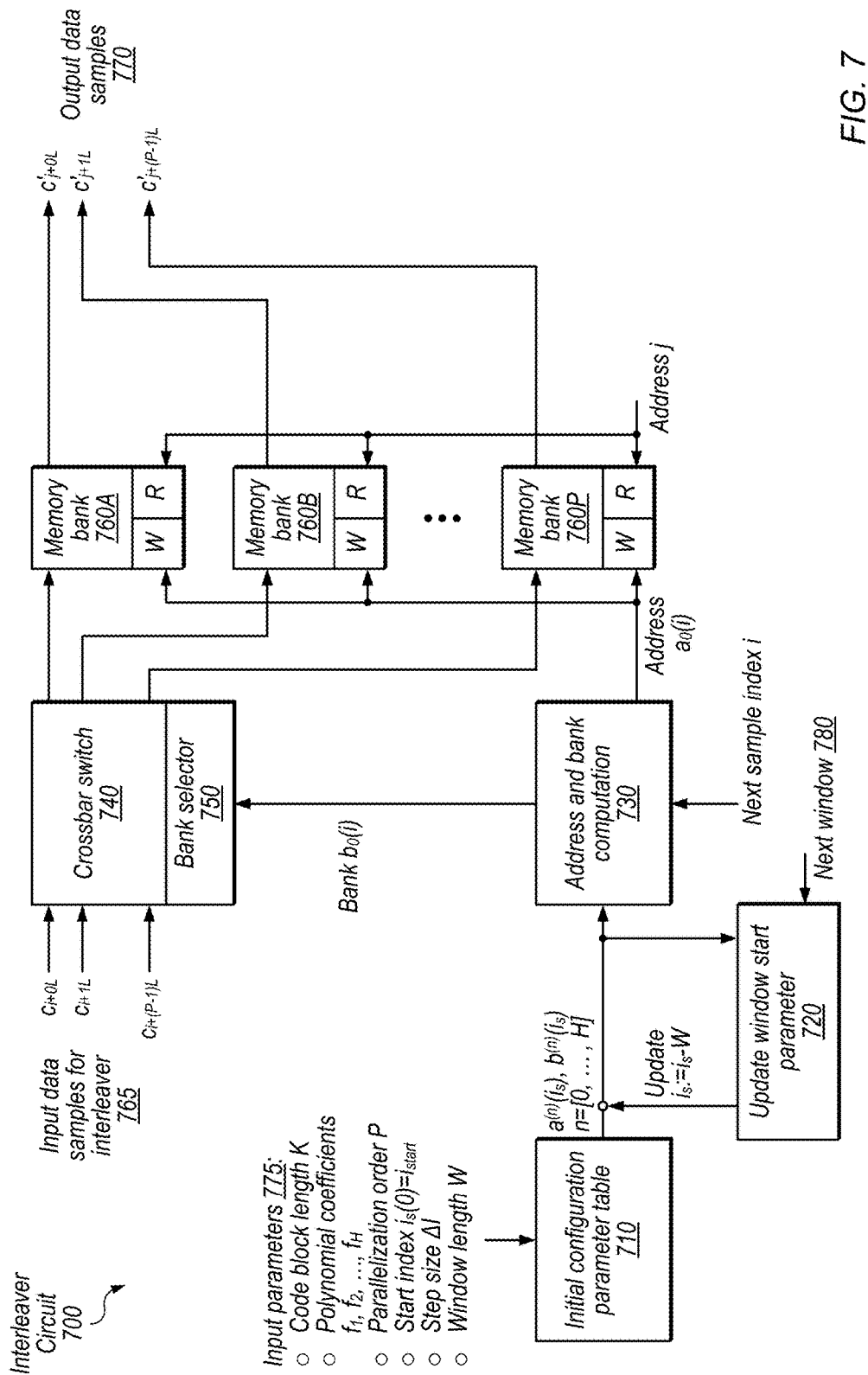
FIG. 7 illustrates an exemplary configurable device configured to implement interleaver and de-interleaver functionality for various interleaver sequences, according to some embodiments.

FIG. 7 is a block diagram illustrating exemplary interleaver circuitry 700 configured to implement one or more of the equations disclosed herein (among others), according to some embodiments. In the illustrated embodiment, the interleaver 700 includes an initial configuration parameter table 710, a module 720 configured to generate an update window start parameter, address and bank computation circuitry 730, crossbar switch 740, bank selector circuitry 750, and memory banks 760A-760P (where P is the parallelization order). In some embodiments, the read and write ports of the memories may be swapped for inverse interleaving (e.g., to implement de-interleavers).

In the illustrated embodiment, interleaver 700 receives input data samples 765 and input parameters 775 and generates output data samples 770. In the illustrated embodiment, input parameters 775 include the code block length K, polynomial coefficients $f_1$ though $f_H$ (where H corresponds to the order of the polynomial), the parallelization order P, the start index $i_s(0)$, the step size $\Delta i$ (which is typically 1 or −1, but may also have other values in some embodiments), and the window length W.

The table 710 for initial configuration parameters, in the illustrated embodiment, is configured to generate initial window start bank and address parameters $a^{(n)}(i_s)$ and $b^{(n)}(i_s)$ for n in 0 through H. In the illustrated embodiment, module 720 updates $i_s$ for each window based on signal 780 indicating that the next window has been reached. Techniques for determining the initial configuration parameters are discussed in further detail below, e.g., with reference to equation 12.

The bank selector circuitry 750 may be configured to implement a function to determine $b_n(i)=f(b_0(i))$ to define the mapping of the crossbar switch, and the function may be based on equation 8 such that it is valid for all index values i. The bank selector circuitry 750 may receive $b_0(i)$ from the address and bank computation circuitry 730, as shown.

In the illustrated embodiment, the crossbar switch 740 is configured to receive input data samples 765 $c_i$ through $c_{i+(P-1)L}$ and route the input data samples 765 based on the output of the bank selector circuitry 750. Based on this routing and the addresses $a_0(i)$ from address and bank computation circuitry 730, the input data samples may be interleaved across the P banks of memory and subsequently accessed as interleaved output data samples 770 $c'_i$ through $c'_{i+(P-1)L}$.

Address and bank computation circuitry 730, in the illustrated embodiment is configured to receive the start bank and address parameters $a^{(n)}(i_s)$ and $b^{(n)}(i_s)$ generated by the table 710 and the index i of the next sample and generate a bank signal $b_0(i)$ and an address signal $a_0(i)$ for a location within the bank. In the illustrated embodiment, only $b_0(i)$ and $a_0(i)$ are shown because: (1) the interleaver addresses can be used for each parallel bank, e.g., as discussed above with reference to equation 5B and shown in equation 6 above and (2) the bank selector circuitry 750 may be configured to derive $b_1(i)$ through $b_{(P-1)}(i)$ from $b_0(i)$. In some embodiments, the address and bank computation circuitry 730 is configured to generate these signals according to equation 11 below:

$$a_0((i + \Delta i) \bmod L) = \qquad \text{Equation 11}$$
$$a^{(0)}((i + \Delta i) \bmod L) = (a^{(0)}(i) + a^{(1)}(i)) \bmod L$$
$$a^{(1)}((i + \Delta i) \bmod L) = (a^{(1)}(i) + a^{(2)}(i)) \bmod L$$
$$\dots = \dots$$
$$a^{(H-1)}((i + \Delta i) \bmod L) = (a^{(H-1)}(i) + a^{(H)}(i)) \bmod L$$

-continued $$b_0((i + \Delta i) \bmod L) = b^{(0)}((i + \Delta i) \bmod L) =$$
$$(b^{(0)}(i) + b^{(1)}(i) + ovr(a^{(0)}(i) + a^{(1)}(i) \geq L)) \bmod P$$

$$b^{(1)}((i + \Delta i) \bmod L) =$$
$$(b^{(1)}(i) + b^{(2)}(i) + ovr(a^{(1)}(i) + a^{(2)}(i) \geq L)) \bmod P$$

$$\ldots =$$

$$b^{(H-1)}((i + \Delta i) \bmod L) = (b^{(H-1)}(i) + b^{(H)}(i) +$$
$$ovr(a^{(H-1)}(i) + a^{(H)}(i) \geq L)) \bmod P$$

Where the function $ovr(m \geq n)=1$ when $m \geq n$ else 0 and where $a^{(H)}(i)=a^{(H)}=\text{const}$; $b^{(H)}(i)=b^{(H)}=\text{const}$.

In some embodiments, the initial configuration parameter computation is done for each code block (interleaver pattern with length K) separately and stored in a lookup table. In some embodiments, the parameters $a^{(0)}(i_s)$, $a^{(1)}(i_s)$, ..., $a^{(H)}(i_s)$ and $b^{(0)}(i_s)$, $b^{(1)}(i_s)$, $b^{(H)}(i_s)$ are determined out of samples $a_0(i_s+0 \cdot \Delta i)$, $a_0(i_s+1 \cdot \Delta i)$, ..., $a_0(i_s+H \cdot \Delta i)$ and ..., $b_0(i_s+0 \cdot \Delta i)$, $b_0(i_s+1 \cdot \Delta i)$, ..., $b_0(i_s+H \cdot \Delta i)$ of the interleaver pattern as follows:

$$a^{(0)}(i_s) = a_0(i_s + 0 \cdot \Delta i) \quad \text{Equation 12}$$
$$b^{(0)}(i_s) = b_0(i_s + 0 \cdot \Delta i)$$
$$a^{(1)}(i_s) = (a_0(i_s + 1 \cdot \Delta i) - a_0(i_s + 0 \cdot \Delta i)) \bmod L$$
$$b^{(1)}(i_s) = (b_0(i_s + 1 \cdot \Delta i) - b_0(i_s + 0 \cdot \Delta i) -$$
$$ovr(a_0(i_s + 1 \cdot \Delta i) - a_0(i_s + 0 \cdot \Delta i) < 0)) \bmod P$$

$$\ldots = \ldots$$

Thus, equation 12 may be used to generate values stored in the initial configuration parameter table 710. In some embodiments, one or more hardware and/or software modules are configured to generate the values in initial configuration parameter table 710, which may then be accessed based on input parameters 775.

In some embodiments, the update window start parameter computation module 720 is configured to create a new set of parameters $a^{(0)}(i_s)$, $a^{(1)}(i_s)$, ..., $a^{(H)}(i_s)$ and $b^{(0)}(i_s)$, $b^{(1)}(i_s)$, $b^{(H)}(i_s)$ for $i_s:=i_s-W$ and thus enables nested linear index lists. These coefficients are also polynomial based and may be constructed recursively in the same way as the interleaver index in Equation 11. In the illustrated embodiments, each set of address and bank coefficients $a^{(n)}(i_s-W)$ and $b^{(n)}(i_s-W)$ for $n=[0, H-1]$ is computed independently, e.g., according to equation 13 below which recursively updates the start address $a^{(n)}(i_s)$ and start bank $b^{(n)}(i_s)$:

$$a^{(n)}((i_s - W) \bmod L) = \quad \text{Equation 13}$$
$$a_n^{(n)}((i_s - W) \bmod L) = (a_n^{(n)}(i_s) + a_{n+1}^{(n)}(i_s)) \bmod L$$
$$\ldots = \ldots$$
$$a_{H-1}^{(n)}((i_s - W) \bmod L) = (a_{H-1}^{(n)}(i_s) + a_H^{(n)}(i_s)) \bmod L$$
$$b^{(n)}((i_s - W) \bmod L) = b_n^{(n)}((i_s - W) \bmod L) =$$
$$(b_n^{(n)}(i_s) + b_{n+1}^{(n)}(i_s) + ovr(a_n^{(n)}(i_s) + a_{n+1}^{(n)}(i_s) \geq L)) \bmod P$$
$$\ldots =$$
$$b_{H-1}^{(n)}((i_s - W) \bmod L) =$$

-continued $$(b_{H-1}^{(n)}(i_s) + b_H^{(n)}(i_s) + ovr(a_{H-1}^{(n)}(i_s) + a_H^{(n)}(i_s) \geq L)) \bmod P$$

Where n=0, 1, ..., H−1; $a_H^{(n)}(i_s)=a_H^{(n)}=\text{const}$; and $b_H^{(n)}(i_s)=b_H^{(n)}=\text{const}$. Therefore, in some embodiments, the update window start parameter module 720 is configured to generate signals according to equation 13.

Therefore, in some embodiments, address and bank computation circuitry is configured to implement equation 11, the initial configuration parameter table is configured according to equation 12, and the update window start parameter circuitry is configured to implement equation 13.

Figure 8:
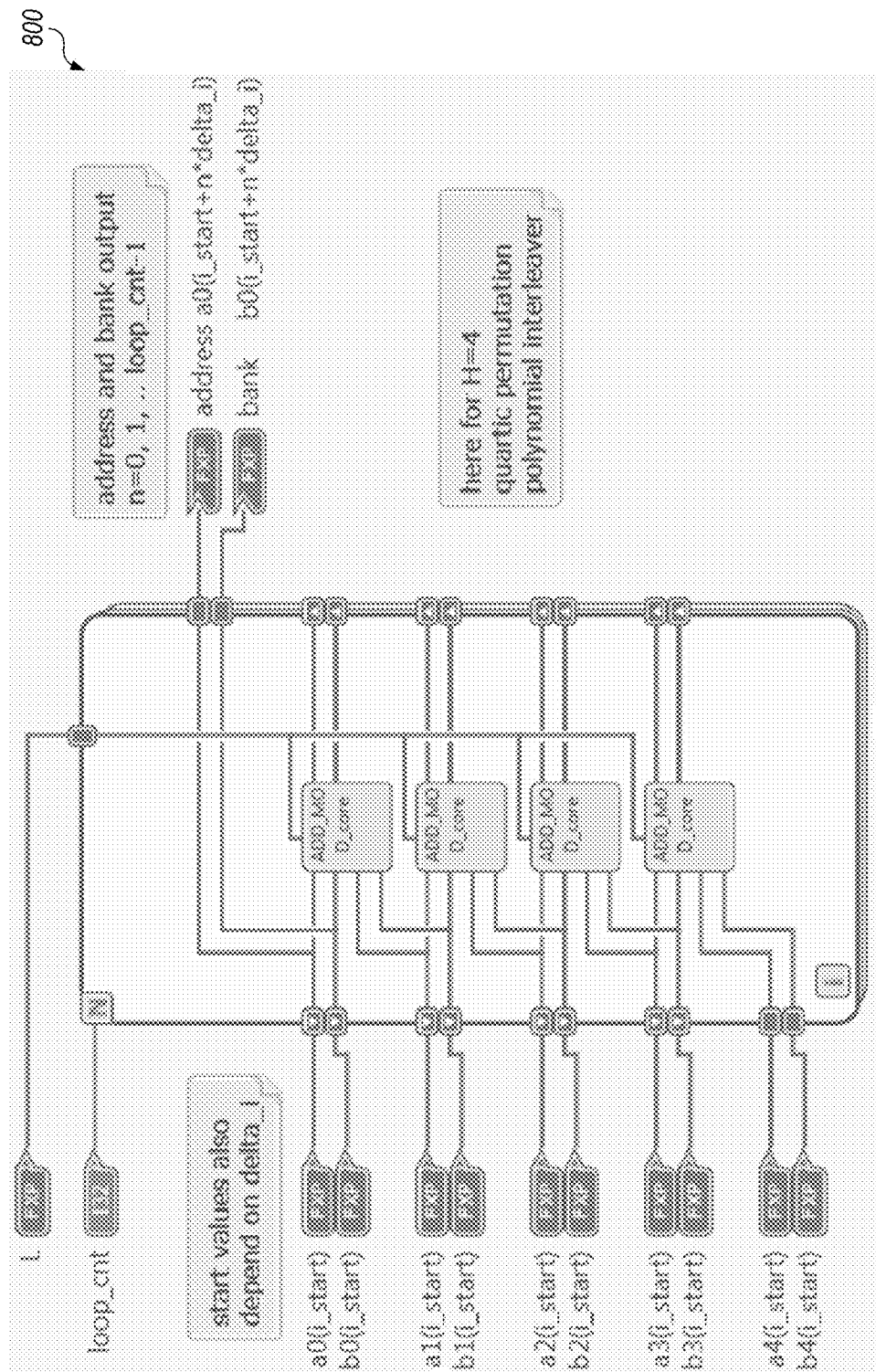
FIG. 8 is a block diagram illustrating a portion of the device of FIG. 7 that includes parallel ADD_MOD cores, according to some embodiments.

In some embodiments, address and bank computation circuitry 730 is configured to create each address and bank coefficient (e.g., based on equation 11) using a structure of ADD-MOD-cores as illustrated in FIG. 8.

FIG. 8 is a Labview diagram that shows a graphical program 800 with a loop that uses four ADD_MOD cores to determine values for $a^{(0)}(i)$ through $a^{(4)}(i)$ and $b^{(0)}(i)$ through $b^{(4)}(i)$ for different $i_{start}$ values. In the illustrated embodiment, H=4, but the number of ADD_MOD cores may be greater or smaller in other embodiments to support different maximum values of H.

In some embodiments, the update window start parameter circuitry is also configured to use similar ADD-MOD circuitry to implement equation 13. In various embodiments, H−1 instantiations of structures similar to FIG. 8 may be needed to implement equation 13 with a descending number of ADD-MOD-core elements (e.g., for $a^{(H)}(i_s)$, $b^{(0)}(i_s)$ H elements are needed, where for $a^{(H-1)}(i_s)$, $b^{(H-1)}(i_s)$ only 1 element is needed). The initial start parameters for these structures may be determined similarly to the actual interleaver index values (determined using equation 12) for example.

In various embodiments, the graphical programs of FIGS. 8 and/or 9 may be used to configure programmable hardware elements or to generate circuit design information for an integrated circuit to implement the specified functionality.

Figure 9:
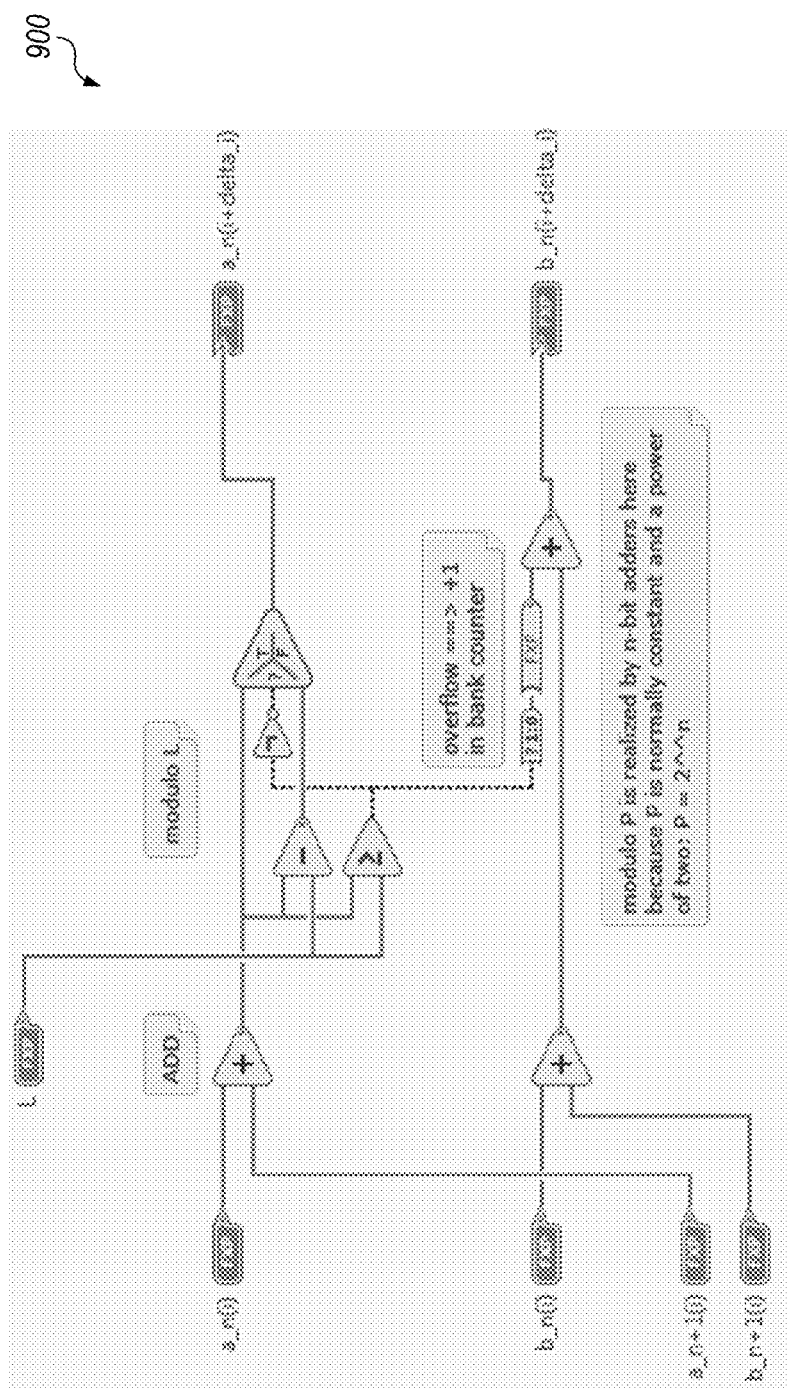
FIG. 9 is a block diagram illustrating an exemplary ADD_MOD core, according to some embodiments.

FIG. 9 is a Labview diagram that shows a graphical program 900 that specifies configuration of an exemplary ADD_MOD core, according to some embodiments. In the illustrated embodiment, the ADD_MOD core receives inputs a_n(i), b_n(i), a_n+1(i), and b_n+1, and L and generates outputs a_n(i+delta_i) and b_n(i+delta_i). In the illustrated embodiment, a_n(i+delta_i) is generated as $(a^{(n)}(i)+a^{(n+1)}(i)) \bmod L$ and b_n(i+delta_i) is generated as:

$$(b^{(n)}(i)+b^{(n+1)}(i)+ovr(a^{(n)}(i)+a^{(n+1)}(i) \geq L)) \bmod P.$$

(Note that a_n(i) in FIGS. 8-9 corresponds to $a^{(n)}(i)$ in the equations above, b_n(i) to $b^{(n)}(i)$, etc., e.g., and the Figs. are shown this way because Labview does not utilize superscripts. Similarly delta_i corresponds to $\Delta i$ in the previous description). In the illustrated embodiment, modulo P is simply implemented using n-bit adders where P is a constant power of 2. In other embodiments, P may be allowed to vary, e.g., by dynamically configuring the hardware for different powers of P and other modulo implementations may be used.

The disclosed interleaver address generation techniques and circuitry support not only polynomial based interleavers of second order but also of higher orders. This may allow implementation of the deinterleaver (inversed interleaver pattern) for LTE by using the inverse permutation instead of swapping read and write address generation. For example, the inverse permutation of the 188 QPP interleaver defined for LTE are polynomial based interleavers over integer rings again but up to fourth order. Generally, the disclosed techniques and circuitry may handle all interleaver definitions with polynomials up to any order, e.g., depending on the amount of parallel circuitry (such as ADD_MOD cores) implemented.

Additionally, the disclosed techniques allow processing of nested linear input index patterns instead of simply linear ones. Thus input index patterns such as 70, 71, 72, . . . , 79, 60, 61, 62, . . . , 69, 50, 51, 52, 59, 40, . . . , 0, 1, . . . 9 are supported, for example. This may allow implementation of a turbo decoder with a windowed MAP decoder for convolutional codes where the output bit information is not in linear order for the complete code segment, but rather nested depending on the window length. With conventional address generation algorithms it would likely be necessary to store separate coefficient sets for each window, which results in large coefficient memories. In contrast, the disclosed techniques significantly reduce the number of required coefficients. Furthermore, the disclosed techniques allow contention-free multiple address generation for parallelized turbo decoding with segmented code blocks of equal length sub segments, which in turn may allow high decoding throughput.

Exemplary Method

FIG. 10 is a flow diagram illustrating a method 1010 for storing data samples in an interleaved manner, according to some embodiments. The method shown in FIG. 10 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 1010, in the illustrated embodiment, one or more processing elements receive the following information: input data samples (e.g., samples 765), a plurality of polynomial coefficients that include coefficients for at least a third-order polynomial, a start index, and information indicating a window size for non-sequential traversal of interleaver indices. The information may further include step size, in some embodiments.

At 1020, in the illustrated embodiment, address circuitry (e.g., address and bank computation circuitry 730) generates bank and address information for writing the received input data samples to ones of a plurality of memory blocks in parallel. In the illustrated embodiment, the generating is based on an order of the polynomial, a code block length, the start index, and the information indicating the window size. For example, the bank and address information may be generated based on one or more of the equations disclosed herein.

At 1030, in the illustrated embodiment, a plurality of memory blocks store interleaved data samples in parallel based on the bank and address information.

At 1040, in the illustrated embodiment, output circuitry outputs interleaved data samples (e.g., samples 770) from the plurality of memory blocks.

Exemplary Devices

In some embodiments, computing devices configured to implement the disclosed techniques may include mobile devices, personal computing devices, base stations, etc. In some embodiments, a mobile device may have cellular communication capability such as a mobile phone, a handheld device, a wearable device, a computer or a tablet, or virtually any type of wireless device.

The computing device may include a processor that is configured to execute program instructions stored in memory. The computing device may perform any of the method embodiments described herein by executing such stored instructions. Alternatively, or in addition, the computing device may include a programmable hardware element such as an FPGA (field-programmable gate array) that is configured to perform any of the method embodiments described herein, or any portion of any of the method embodiments described herein.

The computing device may include one or more antennas for communicating using one or more wireless communication protocols or technologies. The computing device may include a radio which may couple to a single antenna, or may couple to multiple antennas (e.g., for MIMO) for performing wireless communications. In general, a radio may include any combination of a baseband processor, analog RF signal processing circuitry (e.g., including filters, mixers, oscillators, amplifiers, etc.), or digital processing circuitry (e.g., for digital modulation as well as other digital processing). Similarly, the radio may implement one or more receive and transmit chains using the aforementioned hardware.

The computing device may include a system on chip (SOC), which may include portions for various purposes. For example, SOC may include processor(s) which may execute program instructions for the computing device and display circuitry which may perform graphics processing and provide display signals to the display. The processor(s) may also be coupled to memory management unit (MMU), which may be configured to receive addresses from the processor(s) and translate those addresses to locations in memory and/or to other circuits or devices, such as the display circuitry, wireless communication circuitry, a connector I/F, and/or the display. The MMU may be configured to perform memory protection and page table translation or set up. In some embodiments, the MMU may be included as a portion of the processor(s).

The SOC may be coupled to various other circuits of the computing device. For example, the computing device may include various types of memory, a connector interface (e.g., for coupling to a computer system, dock, charging station, etc.), the display, and wireless communication circuitry (e.g., for LTE, Wi-Fi, GPS, etc.).

In some embodiments, a base station (e.g., base station 102) that is configured to store, generate, and/or transmit the disclosed pilot symbols may processor(s) which may execute program instructions for the base station. The processor(s) may also be coupled to memory management unit (MMU), which may be configured to receive addresses from the processor(s) and translate those addresses to locations in memory or to other circuits or devices.

The base station may include at least one network port. The network port may be configured to couple to a telephone network and provide a plurality of devices, such as mobile devices, access to the telephone network as described above in FIG. 1.

The network port (or an additional network port) may also or alternatively be configured to couple to a cellular network, e.g., a core network of a cellular service provider. The core network may provide mobility related services and/or other services to a plurality of devices, such as UE devices 106. In some cases, the network port may couple to a telephone network via the core network, and/or the core network may provide a telephone network (e.g., among other UE devices serviced by the cellular service provider).

The base station may include at least one antenna, and possibly multiple antennas. The antenna(s) may be configured to operate as a wireless transceiver and may be further configured to communicate with UE devices 106 via a radio. The antenna may communicates with the radio via a communication chain. The communication chain may be a receive chain, a transmit chain or both. The radio may be configured to communicate via various wireless telecommunication standards, including, but not limited to, LTE, LTE-A, UMTS, CDMA2000, Wi-Fi, etc.

The base station may be configured to communicate wirelessly using multiple wireless communication standards. In some instances, the base station may include multiple radios, which may enable the base station to communicate according to multiple wireless communication technologies. For example, as one possibility, the base station may include an LTE radio for performing communication according to LTE as well as a Wi-Fi radio for performing communication according to Wi-Fi. In such a case, the base station may be capable of operating as both an LTE base station and a Wi-Fi access point. As another possibility, the base station may include a multi-mode radio which is capable of performing communications according to any of multiple wireless communication technologies (e.g., LTE and Wi-Fi).

The base station may include hardware and software components for implementing or supporting implementation of features described herein. The processor of the base station may be configured to implement part or all of the methods described herein, e.g., by executing program instructions stored on a memory medium (e.g., a non-transitory computer-readable memory medium). Alternatively, the processor may be configured as a programmable hardware element, such as an FPGA (Field Programmable Gate Array), or as an ASIC (Application Specific Integrated Circuit), or a combination thereof.

Embodiments of the present disclosure may be realized in any of various forms. For example, in some embodiments, the present invention may be realized as a computer-implemented method, a computer-readable memory medium, or a computer system. In other embodiments, the present invention may be realized using one or more custom-designed hardware devices such as ASICs. In other embodiments, the present invention may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computing device may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms.

Exemplary Device

Referring now to FIG. 11, a block diagram illustrating an exemplary embodiment of a device 1100 is shown. In some embodiments, device 1100 implements one or more of base station 102 or mobile devices 106. In some embodiments, elements of device 1100 may be included within a system on a chip. In some embodiments, device 1100 may be included in a mobile device, which may be battery-powered. Therefore, power consumption by device 1100 may be an important design consideration. In the illustrated embodiment, device 1100 includes fabric 1110, compute complex 1120 input/output (I/O) bridge 1150, cache/memory controller 1145, graphics unit 1180, and display unit 1165. In some embodiments, device 1100 may include other components (not shown) in addition to and/or in place of the illustrated components, such as video processor encoders and decoders, image processing or recognition elements, computer vision elements, etc.

Fabric 1110 may include various interconnects, buses, MUX's, controllers, etc., and may be configured to facilitate communication between various elements of device 1100. In some embodiments, portions of fabric 1110 may be configured to implement various different communication protocols. In other embodiments, fabric 1110 may implement a single communication protocol and elements coupled to fabric 1110 may convert from the single communication protocol to other communication protocols internally.

In the illustrated embodiment, compute complex 1120 includes bus interface unit (BIU) 1125, cache 1130, and cores 1135 and 1140. In various embodiments, compute complex 1120 may include various numbers of processors, processor cores and/or caches. For example, compute complex 1120 may include 1, 2, or 4 processor cores, or any other suitable number. In one embodiment, cache 1130 is a set associative L2 cache. In some embodiments, cores 1135 and/or 1140 may include internal instruction and/or data caches. In some embodiments, a coherency unit (not shown) in fabric 1110, cache 1130, or elsewhere in device 1100 may be configured to maintain coherency between various caches of device 1100. BIU 1125 may be configured to manage communication between compute complex 1120 and other elements of device 1100. Processor cores such as cores 1135 and 1140 may be configured to execute instructions of a particular instruction set architecture (ISA) which may include operating system instructions and user application instructions.

Cache/memory controller 1145 may be configured to manage transfer of data between fabric 1110 and one or more caches and/or memories. For example, cache/memory controller 1145 may be coupled to an L3 cache, which may in turn be coupled to a system memory. In other embodiments, cache/memory controller 1145 may be directly coupled to a memory. In some embodiments, cache/memory controller 1145 may include one or more internal caches.

As used herein, the term "coupled to" may indicate one or more connections between elements, and a coupling may include intervening elements. For example, in FIG. 11, graphics unit 1180 may be described as "coupled to" a memory through fabric 1110 and cache/memory controller 1145. In contrast, in the illustrated embodiment of FIG. 11, graphics unit 1180 is "directly coupled" to fabric 1110 because there are no intervening elements.

Graphics unit 1180 may include one or more processors and/or one or more graphics processing units (GPU's). Graphics unit 1180 may receive graphics-oriented instructions, such as OPENGL®, Metal, or DIRECT3D® instructions, for example. Graphics unit 1180 may execute specialized GPU instructions or perform other operations based on the received graphics-oriented instructions. Graphics unit 1180 may generally be configured to process large blocks of data in parallel and may build images in a frame buffer for output to a display. Graphics unit 1180 may include transform, lighting, triangle, and/or rendering engines in one or more graphics processing pipelines. Graphics unit 1180 may output pixel information for display images. In the some embodiments, graphics unit 1180 includes a programmable shader core.

Display unit 1165 may be configured to read data from a frame buffer and provide a stream of pixel values for display. Display unit 1165 may be configured as a display pipeline in some embodiments. Additionally, display unit 1165 may be configured to blend multiple frames to produce an output frame. Further, display unit 1165 may include one or more interfaces (e.g., MIPI® or embedded display port (eDP)) for coupling to a user display (e.g., a touchscreen or an external display).

I/O bridge 1150 may include various elements configured to implement: universal serial bus (USB) communications, security, audio, and/or low-power always-on functionality, for example. I/O bridge 1150 may also include interfaces such as pulse-width modulation (PWM), general-purpose input/output (GPIO), serial peripheral interface (SPI), and/or inter-integrated circuit (I2C), for example. Various types of peripherals and devices may be coupled to device 1100 via I/O bridge 1150.

Exemplary Computer-Readable Medium

The present disclosure has described various exemplary circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 12B:
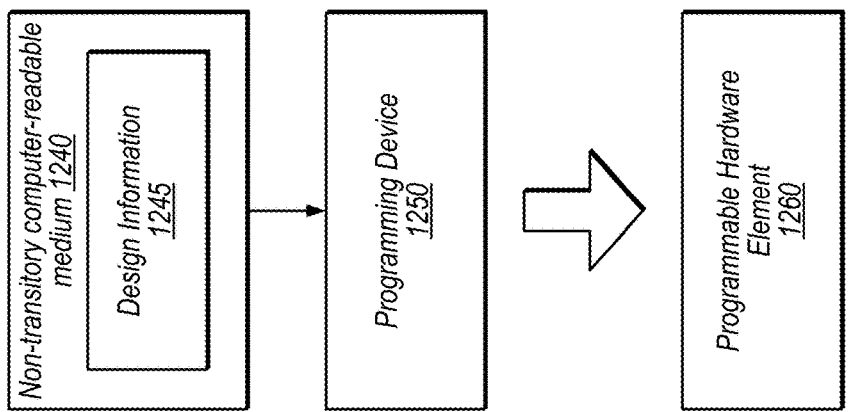
FIGS. 12A-12B are a block diagram illustrating exemplary computer-readable mediums, according to some embodiments.
Figure 12A:
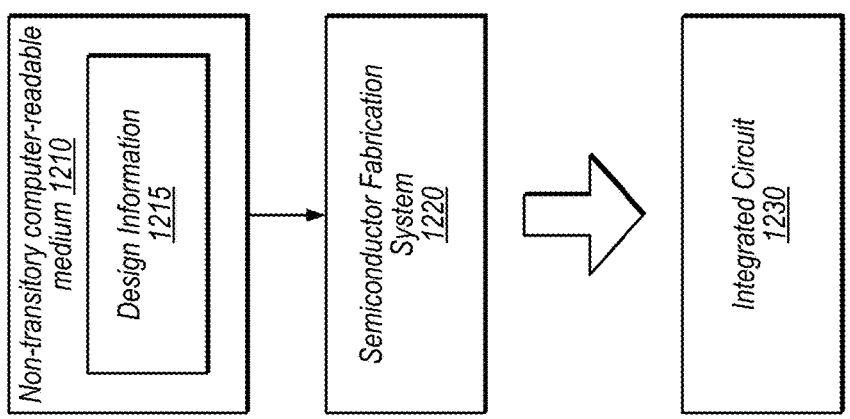

FIG. 12A is a block diagram illustrating an exemplary non-transitory computer-readable storage medium that stores circuit design information, according to some embodiments. In the illustrated embodiment semiconductor fabrication system 1220 is configured to process the design information 1215 stored on non-transitory computer-readable medium 1210 and fabricate integrated circuit 1230 based on the design information 1215.

Non-transitory computer-readable medium 1210, may comprise any of various appropriate types of memory devices or storage devices. Medium 1210 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Medium 1210 may include other types of non-transitory memory as well or combinations thereof. Medium 1210 may include two or more memory mediums which may reside in different locations, e.g., in different computer systems that are connected over a network.

Design information 1215 may be specified using any of various appropriate computer languages, including hardware description languages such as, without limitation: VHDL, Verilog, SystemC, SystemVerilog, RHDL, M, MyHDL, etc. Design information 1215 may be usable by semiconductor fabrication system 1220 to fabrication at least a portion of integrated circuit 1230. The format of design information 1215 may be recognized by at least one semiconductor fabrication system 1220. In some embodiments, design information 1215 may also include one or more cell libraries which specify the synthesis and/or layout of integrated circuit 1230. In some embodiments, the design information is specified in whole or in part in the form of a netlist that specifies cell library elements and their connectivity.

Semiconductor fabrication system 1220 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1220 may also be configured to perform various testing of fabricated circuits for correct operation.

In various embodiments, integrated circuit 1230 is configured to operate according to a circuit design specified by design information 1215, which may include performing any of the functionality described herein. For example, integrated circuit 1230 may include any of various elements shown in FIGS. 1-4, 7-9, and/or 11. Further, integrated circuit 1230 may be configured to perform various functions described herein in conjunction with other components. Further, the functionality described herein may be performed by multiple connected integrated circuits.

FIG. 12B is a block diagram illustrating an exemplary non-transitory computer-readable storage medium that stores design information for a programmable hardware element, according to some embodiments. In the illustrated embodiment programming device 1250 is configured to process the design information 1245 stored on non-transitory computer-readable medium 1240 and program programmable hardware element 1260 based on the design information 1245.

Medium 1240 and design information 1245 may have features similar to medium 1210 and design information 1215, as discussed above. Hardware description languages used to design ASICs may be similar or different than those used to program programmable hardware elements. Programmable hardware element 1260 may be a field-programmable gate array (FPGA), programmable logic array (PLA), complex programmable logic device (CPLD) etc. Programmable hardware element 1260 may include logic blocks, hard blocks for common functions, configurable clocking structures, memories, fuses, etc. A given programmable hardware element 1260 may be programmed differently at different times, e.g., by adjusting the functionality of the logic blocks, interconnections between circuit elements, etc.

In various embodiments, programmable hardware element 1260 is configured, after being programmed, to operate according to the circuit design specified by design information 1245, which may include performing any of the functionality described herein. For example, programmable hardware element 1260 may implement any of various elements shown in FIGS. 1-4, 7-9, and/or 11. Further, programmable hardware element 1260 may be configured to perform various functions described herein in conjunction with other components. Further, the functionality described herein may be performed by multiple connected programmable hardware elements.

As used herein, the term "implement the circuit according to the design" includes both fabricating an integrated circuit according to the design and programming a programmable hardware element according to the design. Semiconductor fabrication system 1220 and programming device 1250 are examples of computing systems configured to implement circuits according to design information. Speaking generally, implementing a circuit according to a design may include other ways to implement hardware circuits in addition to the techniques discussed with references to FIGS. 12A and 12B. This term is intended to cover all such techniques for implementing hardware circuits according to design information stored in a computer-readable medium.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. An apparatus, comprising:
   a plurality of memory blocks configured to store interleaved input data samples in parallel;
   one or more circuit elements configured to:
      receive input data samples, a plurality of polynomial coefficients, a start index, and information indicating a window size for non-sequential traversal of interleaver indices, wherein the plurality of polynomial coefficients includes coefficients for at least a third-order polynomial; and
      generate interleaved bank and address information for writing the input data samples to the plurality of memory blocks, based on an order of the polynomial, a code block length, the start index, and the information indicating the window size; and
   output circuitry configured to provide interleaved data samples from the plurality of memory blocks.

2. The apparatus of claim 1, wherein the number of memory blocks used to store interleaved input data samples corresponds to a parallelization order.

3. The apparatus of claim 1, wherein the one or more circuit elements include update window circuitry configured to generate updated start indices independently by recursively updating start address and start bank for nested linear index lists.

4. The apparatus of claim 3, wherein the update window circuitry includes a plurality of elements that are each configured to perform addition and modulus operations.

5. The apparatus of claim 4, wherein a number of the plurality of elements corresponds to an order of the polynomial.

6. The apparatus of claim 1, wherein the one or more processing elements are further configured to receive information indicating a step size, a step direction, and a code block length and one or more circuit elements are configured to generate the bank and address information based on the received information.

7. The apparatus of claim 1, wherein apparatus is configured to use the interleaved data samples for turbo decoding operations.

8. A method, comprising:
   receiving, by one or more processing elements:
      input data samples;
      a plurality of polynomial coefficients that include coefficients for at least a third-order polynomial;
      a start index; and
      information indicating a window size for non-sequential traversal of interleaver indices;
   generating, by address circuitry, bank and address information for writing the input data samples to ones of a plurality of memory blocks in parallel, wherein the generating is based on: an order of the polynomial, a code block length, the start index, and the information indicating the window size;
   storing, by the plurality of memory blocks, interleaved input data samples in parallel based on the bank and address information; and
   outputting, by output circuitry, interleaved data samples from the plurality of memory blocks.

9. The method of claim 8, wherein the number of memory blocks used to store interleaved input data samples corresponds to a parallelization order.

10. The method of claim 8, further comprising:
    generating, by window update circuitry, updated start indices independently by recursively updating start address and start bank.

11. The method of claim 8, wherein the generating uses a plurality of addition and modulus units.

12. The method of claim 8, further comprising receiving information indicating a step size, a step direction, and a code block length, wherein the generating the bank and address information is further based on the received information.

13. The method of claim 8, wherein the interleaver indices comprise a nested linear input index pattern.

14. The method of claim 8, further comprising generating initial parameters for the address circuitry.

15. A non-transitory computer readable storage medium having stored thereon design information that specifies a design of at least a portion of a hardware circuit in a format recognized by a computing system configured to use the design information to implement the circuit according to the design, including:
    a plurality of memory blocks configured to store interleaved input data samples in parallel;
    one or more circuit elements configured to:
       receive input data samples, a plurality of polynomial coefficients, a start index, and information indicating a window size for non-sequential traversal of interleaver indices, wherein the plurality of polynomial coefficients includes coefficients for at least a third-order polynomial; and generate interleaved bank and address information for writing the input data samples to the plurality of memory blocks, based on an order of the polynomial, a code block length, the start index, and the information indicating the window size; and output circuitry configured to provide interleaved data samples from the plurality of memory blocks.

16. The non-transitory computer readable storage medium of claim 15, wherein the design information specifies that the circuit is configured to use a number of memory blocks to store the interleaved input data samples that corresponds to a parallelization order for generating the interleaved bank and address information.

17. The non-transitory computer readable storage medium of claim 15, wherein the design information specifies that the one or more circuit elements include update window circuitry configured to generate updated start indices independently by recursively updating start address and start bank for nested linear index lists.

18. The non-transitory computer readable storage medium of claim 15, wherein the design information specifies that the one or more circuit elements configured to generate interleaved bank and address information include a plurality of add-modify elements.

19. The non-transitory computer readable storage medium of claim 15, wherein the design information specifies that the circuit includes crossbar circuitry configured to assign input samples to memory blocks based on the generated interleaved bank information.

20. The non-transitory computer readable storage medium of claim 15, wherein the interleaver indices comprise a nested linear input index pattern corresponding to at least a fourth-order polynomial.

* * * * *